Figure 1:
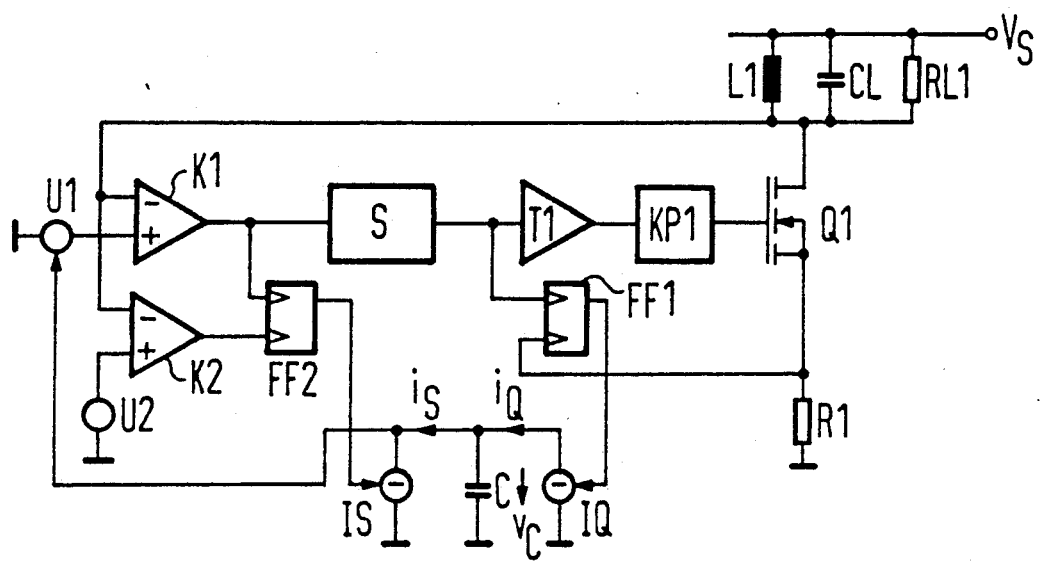

United States Patent [19]

Erckert

[11] Patent Number: 5,032,972
[45] Date of Patent: Jul. 16, 1991

[54] METHOD AND CIRCUIT CONFIGURATION FOR INCREASING THE EFFICIENCY OF RESONANT CONVERTER POWER SUPPLY CIRCUITS

[75] Inventor: Ricardo Erckert, Munich, Fed. Rep. of Germany

[73] Assignee: Siemens Aktiengesellschaft, Munich, Fed. Rep. of Germany

[21] Appl. No.: 433,672

[22] Filed: Nov. 7, 1989

[30] Foreign Application Priority Data

Nov. 7, 1988 [DE] Fed. Rep. of Germany ....... 3837749

[51] Int. Cl.⁵ .................... H02M 7/537; H02M 7/538
[52] U.S. Cl. ........................................ 363/97; 363/131
[58] Field of Search ................... 363/16, 20, 21, 97, 363/131

[56] References Cited

U.S. PATENT DOCUMENTS

| | | |
|---|---|---|
| 3,596,165 | 7/1971 | Andrews . |
| 4,413,313 | 11/1983 | Robinson ............................ 363/16 |
| 4,464,709 | 8/1984 | Barter ................................. 363/16 |
| 4,535,399 | 8/1985 | Szepesi .............................. 363/16 |
| 4,587,604 | 5/1986 | Nerone .............................. 363/17 |
| 4,709,316 | 11/1987 | Ngo et al. ......................... 363/21 |
| 4,727,469 | 2/1988 | Kammiller ........................ 363/56 |
| 4,758,940 | 7/1988 | Steigerwald ..................... 363/98 |
| 4,845,605 | 7/1989 | Steigerwald ..................... 363/21 |
| 4,896,255 | 1/1990 | Schlenk et al. .................. 363/16 |

FOREIGN PATENT DOCUMENTS

| | | |
|---|---|---|
| 261018 | 3/1988 | European Pat. Off. . |
| 0293874 | 7/1988 | European Pat. Off. . |
| 320410 | 6/1989 | European Pat. Off. . |

OTHER PUBLICATIONS

Publication Unitrode Circuits Corporation, Merrimack, N.H., Unitrode Integrated Circuits, Larry Wofford "UC1860—New IC Controls Resonant Mode Power Circuits".
Publication Linear Applications Handbook; National Semiconductor 1980.
U.S. Publication, "IEEE Transactions on Industry Applications", vol. 1A-21, (1985), Nov.-Dec., No. 6, New York, article "Arc Suppression of a DC energized Contactor Under Inductive Load" by D. A. Passey and Ch. F. Chen, pp. 1354-1358.
U.S. Publication, IBM Techn. Discl. Bulletin, vol. 20, No. 7, Dec. 1977, "Circuit for Presynchronization of an Alternating Signal Insertion Relay" by H. Braquet, M. Ferry & G. Arengo, pp. 2716-2717.
Great Britian, publication 8181 New Electronics (1988), Nov., Horten Kirby, Kent, GB, article "Resonance is the Key to Power Density", pp. 42-56.

*Primary Examiner*—William H. Beha, Jr.
*Attorney, Agent, or Firm*—Herbert L. Lerner; Laurence A. Greenberg

[57] ABSTRACT

A method and circuit configuration for closed-loop control of trigger signals of switching transistors in a resonant converter power supply circuit element having closed-loop control dependent on a zero crossing recognition, wherein a prematurely responding zero crossing detector is provided, includes comparing a period of time between the generation of a trigger signal and the switching of a power transistor with a time interval between a premature response of a zero crossing detector and an actual zero crossing. This is done in order to obtain a closed-loop control signal for controlling a deviation action threshold of the zero crossing detector.

7 Claims, 1 Drawing Sheet

METHOD AND CIRCUIT CONFIGURATION FOR INCREASING THE EFFICIENCY OF RESONANT CONVERTER POWER SUPPLY CIRCUITS

The invention relates to a method and circuit configuration for closed-loop control of the trigger signals of the switching transistors in a resonant converter power supply circuit component or element having closed-loop control dependent on a zero crossing recognition, wherein a prematurely responding zero crossing detector is provided.

Zero crossing detectors are generally known, particularly from the Linear Applications Handbook, 1980, of National Semiconductor, pp. AN31-17, AN41-2, AN41-3, AN74-5, LB6-2 and PB12-2. Page AN31-17 shows a fast zero crossing detector that has a signal transit time of approximately 200 ns.

One possible use for zero crossing detectors is to trigger switching transistors of resonant converter power supply circuit elements.

Among other sources, U.S. Pat. Nos. 3,596,165, 4,464,709, and 4,535,399, European Patent Application No. 0 293 874, and Unitrode Integrated Circuit Corporations data sheets for the UC1860 and UC3860 components disclose resonant converter power supply circuit elements. In such power supply circuit elements, the switching transistors are largely powerless. In other words, they are switched on or off either with a negligibly low current (zero current switch) or a negligibly low voltage (zero voltage switch). The advantage of both methods is that switching is done without power, so that a higher switching frequency by approximately one order of magnitude is attainable, as compared with other power supply circuit elements. Zero voltage switch circuits additionally have the advantage of not requiring that parasitic capacitances be recharged in the transformer of the power supply circuit element. However, the load of the power supply circuit element must be variable within narrow limits. Zero current switch circuits are suitable for a wide load range, but the parasitic components must be recharged in their transformer, which among other things leads to a limitation in the maximum possible switching frequency.

U.S. Pat. No. 3,596,165 and 4,464,709 both show self-oscillating resonant converter power supply circuit elements which operate by the push-pull principle and in which the oscillation is interrupted as a function of the zero crossing. During the crossing of the current through zero, the two power switching transistors are not switched over but are only switched off. The frequency of the switching transistor trigger signals does not follow the natural frequency of the resonant circuit and is merely shifted from the resonant point in order to regulate the output voltage the operating point of the resonant circuit, so that the resonant circuit is operated above or below its resonant frequency, as the case may be, as a function of the input voltage and load.

Such power supply circuit elements function, for instance, by the half-wave principle. That is, the primary current remains at zero for a predetermined period after each half wave. No zero crossing detection is provided. In order to prevent one transistor from being switched on before the other is switched off, the other transistor can be blocked by a monostable multivibrator, for instance, when the first transistor is switched on. The blocking time provided by the monostable multivibrator must be at least as long as the longest duration in the most unfavorable case of a primary current half wave, which is primarily determined by the allowable load variation ranges, the supply voltage and the transformer. The maximum switching frequency is defined by the monostable multivibrator. Neither the degree of utilization of the various power components of the power supply circuit element nor the efficiency is particularly high in such circuits.

U.S. Pat. No. 4,535,399 shows a resonant converter power supply circuit element operating by the push-pull principle, in which the output voltage is regulated through the combination of a PLL control circuit and the principle of pulse width modulation. The trigger frequency and the frequency of the resonant circuit are synchronized through the PLL control circuit. The resonant circuit is operated above its natural frequency. In order to synchronize these two frequencies, the primary current of the converter is carried through a limiting stage of the PLL circuit. Neither detection of the zero crossings of the current nor the attendant automatic follow-up control of the trigger frequency to suit the natural frequency of the resonant circuit is provided. Regulation of the output voltage is effected through the controller that operates by the principle of pulse width modulation. The ON time of the two power transistors is directly dependent on the output load or on the input voltage of the resonant converter. As a result, it can be switched off only within a narrow load or input voltage range at the zero crossing of the current; the commutation of the resonant circuit is compulsory.

European Patent Application No. 0 293 874 shows resonant converter power supply circuit elements using a regulating method in which the trigger frequency is adapted to the applicable natural frequency as a function of the secondary load. To this end, the zero crossing of the primary current is detected through a zero crossing detector, and this actual zero crossing is used as a criterion for switching the switching transistors on and off. Therefore the maximum switching frequency is no longer dependent on the half-wave shape of the primary current, a shape that is established if the input voltage and load conditions are unfavorable. Thus such power supply circuit elements are more efficient than the elements referred to earlier above.

However, if the switching frequency is high, then the signal transit time makes itself felt in the control circuit triggered through the zero crossing detector. In such power supply circuit elements, the positive and negative half-waves cannot follow one another directly. A pause, which is on the order of the signal transit time of the control loop, is necessary between the shutoff of the transistor that switches one half wave and the switching on of the transistor that switches the other half wave. The majority of the signal transit time of the control loop is typically furnished by the driver stage, the coupling network connected to its output side, and the switching transistors.

In order to lessen the disadvantages entailed by the signal transit time in the control loop, a zero crossing detector with derivative action can be used. The derivative action time is as long as the signal transit time through the control loop. This makes it possible to provide a zero crossing detector with a fixed derivative action level, in which the derivative action time results from the steepness of the edge of the electrical variable detected. In other words, it is possible to provide a zero crossing detector having a higher threshold. In that case, however, the derivative action must be selected in such a way that the derivative action time for the least favorable, still allowable half-wave shape of the primary current, which depends on the input voltage and on the load, is at most as long as the signal transit time through the control loop. Therefore even with conventional power supply circuit elements having a control which includes a zero crossing detector with derivative action, the efficiency and maximum switching frequency are limited not only by the combination of the least favorable load and least favorable input voltage but also by the allowable variation of the components. This is true for both zero voltage switch power supply circuit elements and zero current switch power supply circuit elements.

A closed-loop-controlled push-pull serial resonant converter power supply circuit element for methods of the generic type in question is known from U.S. Pat. No. 4,727,469 to Kammiller and in part from U.S. Pat. No. 4,587,604. Kammiller describes a power supply circuit element with a control circuit, having two power switches in a half-bridge configuration, the connecting node of which is connected to a reference potential through a series circuit being formed of the primary winding of a transformer, an inductive resistor, and a capacitor. Through the use of two suitably connected clamp diodes, the voltage over this capacitor is prevented from exceeding or dropping markedly below the upper or lower supply potential, respectively. The secondary side of the transformer is connected through a two-way or full-wave rectifier to a smoothing capacitor, to which a load can be connected in parallel. Through the use of a control loop, the secondary voltage is kept constant by varying the trigger pulse clock frequency, which is controlled through a VCO. The current crossing is detected by a zero crossing detector, and the duration of each trigger pulse is controlled as a function of the current crossing. Kammiller discloses embodiments of the control element of generic power supply circuit elements.

It is accordingly an object of the invention to provide a method and circuit configuration for increasing the maximum possible efficiency, frequency and utilization of the power components in resonant converter power supply circuit elements having a zero crossing detector, which overcome the hereinafore-mentioned disadvantages of the heretofore-known methods and devices of this general type, and which makes actuation and shut-off possible in the zero crossing of the primary current or primary voltage in resonant converter power supply circuit elements, regardless of an input voltage varying within an allowed range, a load varying within the allowed range, or the signal transit time of the control loop.

With the foregoing and other objects in view there is provided, in accordance with the invention, a method for closed-loop control of trigger signals of switching transistors in a resonant converter power supply circuit element having closed-loop control dependent on a zero crossing recognition, wherein a prematurely responding zero crossing detector is provided, which comprises comparing a period of time between the generation of a trigger signal and the switching of a power transistor with a time interval between a premature response of a zero crossing detector and an actual zero crossing, in order to obtain a closed-loop control signal for controlling a deviation action threshold of the zero crossing detector.

In accordance with another mode of the invention, there is provided a method which comprises ascertaining the actual zero crossing with a zero crossing detector without deviation action, and enabling the trigger signals with a zero crossing detector having deviation action.

In accordance with a further mode of the invention, there is provided a method which comprises operating the resonant converter power supply circuit element by the zero current switch method.

In accordance with an added mode of the invention, there is provided a method which comprises operating the resonant converter power supply circuit element by the zero voltage switch method.

In accordance with an additional mode of the invention, there is provided a method which comprises operating the resonant converter power supply circuit element by the single-phase method.

In accordance with yet another mode of the invention, there is provided a method which comprises operating the resonant converter power supply circuit element by the push-pull method.

With the objects of the invention in view, there is also provided, in a resonant converter power supply circuit element having a switching transistor and closed-loop control dependent on a zero crossing recognition, a circuit configuration for closed-loop control of trigger signals for the switching transistor, comprising a prematurely responding zero crossing detector having deviation action, an output and a deviation action threshold, a zero crossing detector without deviation action having an output; a first RS flip-flop triggered at rising edges and a second edge-triggered RS flip-flop each having setting and resetting inputs and an output; at least one driver stage having a trigger signal acting upon the setting input of the first RS flip-flop, the at least one driver stage triggering the switching transistor, the first RS flip-flop being reset as a function of the switching state of the switching transistor; and a time comparison stage having two inputs and an output, the output of the first RS flip-flop being connected to one of the inputs of the time comparison stage; the output of the zero crossing detector having deviation action being connected to the setting input of the second RS flip-flop; the output of the zero crossing detector without deviation action being connected to the resetting input of the second RS flip-flop; and the output of the second RS flip-flop being connected to another of the inputs of the time comparison stage; the output of the time comparison stage providing an outcome of a comparison of the signal duration of output signals of the first and second RS flip-flops for controlling the deviation action threshold of the zero crossing detector having deviation action.

In accordance with a concomitant feature of the invention, the time comparison stage is formed of a capacitor, a switchable current source for charging the capacitor, and a switchable current sink for discharging the capacitor; the current source has a control input forming one of the inputs of the time comparison stage and the current sink has a control input forming the other input of the time comparison stage; and the time comparison stage has an output variable being the instantaneous voltage value present across the capacitor.

Other features which are considered as characteristic for the invention are set forth in the appended claims.

Although the invention is illustrated and described herein as embodied in a method and circuit configuration for increasing the maximum possible efficiency, frequency and utilization of the power components in resonant converter power supply circuit elements having a zero crossing detector, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
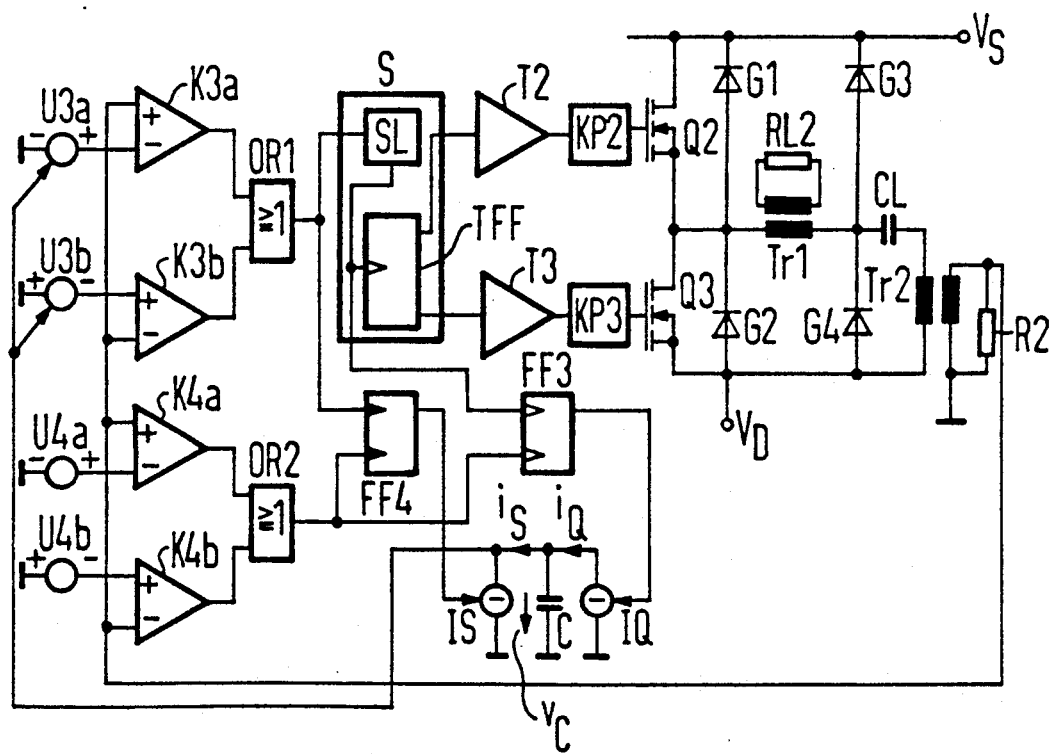

FIG. 1 is a basic schematic circuit diagram of a single-phase zero voltage switch resonant converter circuit element according to the invention; and FIG. 2 is a basic circuit diagram of a push-pull zero current switch resonant converter circuit element according to the invention.

Since generic resonant converter power supply circuit elements are described at length in the aforementioned European Patent Application No. 0 293 874, at least in the form of zero current switch resonant converters, and since conventional control elements for triggering the power transistors of such power supply circuit elements are sufficiently well known from the above-named publications among other sources, the specific construction of circuits known to one skilled in the art, such as driver stages, control elements, coupling networks and comparators, will not be described in detail below. Zero voltage switch resonant converters are also known in principle, and the specialized embodiment of such circuits can be learned from the publications described by applying the current/voltage analogy (dual circuits).

Referring now to the figures of the drawing in detail and first, particularly, to FIG. 1 thereof, there is seen a resonant converter power supply circuit element of the single-phase zero voltage switch type, as a possible exemplary embodiment according to the invention. In a single-phase circuit, only one power transistor Q1 is needed. In zero voltage switch resonant converter circuit elements, the resonant circuit is constructed as a parallel circuit, in this case being formed of an inductive resistor L1, a capacitor CL and a guide value formed by a resistor RL1. An operating potential $V_S$ is connected through the resonant circuit L1, CL, RL1 to the drain terminal of the power switching transistor Q1. The control input of the power switching transistor Q1 is connected through a first coupling network KP1, which in particular includes a pulse transformer and optionally a damping element, to the output of a first driver stage T1. The input of the first driver stage T1 is connected to the signal output of a control element S. The control element is constructed in a known manner and may include a control logic circuit, an oscillator and various protection circuits, such as low-voltage and excess current protectors, among other components. The source terminal of the power switching transistor Q1 is connected to the reference potential through a first measuring resistor R1. In this case, the voltage dropping across the first measuring resistor R1 can serve as an indicator of the switching state of the power switching transistor Q1. The setting input of a first RS flip-flop FF1 triggered at rising edges is connected to the signal input of the first driver stage T1. One important aspect in this connection is that the connection point be located before the first driver stage; in fact, it can even be located in the control element S. The resetting input of the first flip-flop FF1 is connected to the source terminal of the power switching transistor Q1. The output of the first flip-flop FF1 is connected to the control input of a switchable constant current source IQ. The switchable constant current source IQ is connected in such a way that in the ON state it charges a capacitor C, which is connected toward reference potential, with a current $i_Q$. A switchable constant current sink IS is connected in such a way that in the ON state it discharges the capacitor C with a current $i_S$. The connecting point between the drain terminal of the power switching transistor Q1 and the resonant circuit L1, CL, RL1 is connected to the two inverting inputs of a first comparator K1 and a second comparator K2. The non-inverting input of the second comparator K2 is subjected to a constant potential supplied through a constant current source U2, in such a way that the comparator switches over whenever the voltage at the drain terminal of the power switching transistor Q1 is so low that switching of the power switching transistor Q1 leads to negligibly low power losses. The non-inverting input of the first comparator K1 is connected to a controllable voltage source U1. A circuit node between the constant current source IQ, the constant current sink IS and the capacitor C is connected to the control input of the controllable voltage source U1. The circuit element described above, which is formed of the switchable constant current source IQ, the switchable constant current sink IS and the capacitor C, serves as a time comparison stage, in which the voltage $v_C$ across the capacitor C, which can be picked up at the connecting node of these three circuit elements IS, IQ and C, depends on the comparison of the duration of a signal present at the control input of the current source IQ with the duration of a signal present at the control input of the current sink IS. In circuits according to the invention, any other time comparison stage may also be used. The signal output of the first comparator K1 is connected to the signal input of the control element S, and is also connected to the setting input of a second edge-triggered RS flip-flop FF2. The signal output of the second comparator K2 is connected to the resetting input of the second RS flip-flop FF2, and the control output of the second RS flip-flop FF2 is connected to the control input of the current sink IS.

The first comparator K1 is typically adjusted in such a way that its switching threshold is above the switching threshold of the second comparator K2 which indicates a zero crossing.

Zero crossing detectors as described above are formed of comparators and have a signal transit time of approximately 5 to 10 ns. The signal transit time through known control elements S is also in the nanosecond range, and therefore is vanishingly short compared with the signal transit time with which a fast driver stage T1, a fast coupling circuit KP1 and a power switching transistor Q1 are burdened. The signal transit time through this kind of circuit chain T1, KP1, Q1 is on the order of magnitude of 80 to 100 ns. The transit time through the driver stage, the coupling stage and the power switching transistor can therefore, in a good approximation, be equal to the transit time of a complete closed-loop control circuit being formed of a driver stage, coupling circuit, power switching transistor, zero crossing detector and control element. In a circuit in accordance with FIG. 1, the first RS flip-flop FF1 is set with the trigger signal of the first driver stage T1. As soon as the power switching transistor Q1 switches, the first flip-flop FF1 is reset. As long as the first flip-flop FF1 is set, the switchable constant current source IQ is switched on and charges the capacitor C with a constant current $i_Q$. The charge quantity in the capacitor C is thus a measure of the signal transit time through the driver stage T1, the coupling network KP1 and the switching transistor Q1. The comparator K1, which emits a signal to the control element S before the voltage at the drain terminal at the power switching transistor Q1 attains the genuine zero crossing, sets the second RS flip-flop FF2. The second flip-flop FF2 is reset in the zero crossing of the drain voltage of the power switching transistor Q1 detected by the second comparator.

Thus the second flip-flop FF2 is set during the derivation action time with which the first comparator K1 switches prior to the actual zero crossing. While the second flip-flop FF2 is set, the capacitor C is discharged through the switchable constant current sink IS. If the signal transit time during which the first flip-flop FF1 is set is of equal length to the derivation action time set in the first comparator K1, during which the second flip-flop FF2 is set, then the voltage $v_C$ dropping across the capacitor C remains constant on average, and the voltage at the non-inverting input of the first comparator K1, which voltage sets the derivation action and is furnished by the controllable voltage source U1, is not changed. If the derivation action time deviates from the signal transit time, this causes a corresponding change in the voltage $v_C$, and the derivation action threshold is correspondingly followed up through the controllable voltage source U1.

The voltage variation $dv_C$ at the capacitor C is composed as follows, in the exemplary embodiment of FIG. 1:

$$dv_C = (i_Q t_{T1,KP1,Q1} - i_S t_{K1}) 1/C$$

where $t_{T1,KP1,Q1}$ is equivalent to the transit time through the driver stage T1, the coupling network KP1 and the power switching transistor Q1, and $t_{K1}$ is equivalent to the derivation action time of the zero crossing detector. If $i_S$ and $i_Q$ are of equal magnitude, then a derivation action time $t_{K1}$ is obtained that is set in such a way that the power switching transistor Q1 switches at the zero voltage crossing. The derivation action time is cancelled out except for a residual error; the transit time through the comparator K1 and through the control element S is equivalent to this residual error.

Upon the attainment of a maximum current value in the control element S, which is specified by the closed-loop control, the control element S switches off the power switching transistor Q1.

FIG. 2 shows a basic circuit diagram of a push-pull zero current switch resonant converter circuit element according to the invention. In the illustrated exemplary embodiment, second and third power switching transistors Q2 and Q3 are provided, with the second power switching transistor Q2 being provided for switching the positive half-wave and the third power switching transistor Q3 being provided for switching the negative half-wave. The drain terminal of the second power switching transistor Q2 is connected to a supply potential $V_S$. The source terminal of the second power switching transistor Q2 is connected to the drain terminal of the third power switching transistor Q3, it is connected to one terminal of the primary winding of a transformer Tr1, it is clamped through a first switching diode G1 to the supply potential $V_S$ and it is also connected through a second switching diode G2 to a negative supply potential $V_D$, which is connected to the source terminal of the third power switching transistor Q3. The transformer Tr1 is loaded by a load RL2. The other terminal of the primary winding of the transformer Tr1 is likewise clamped to the supply potential $V_S$ through a third switching diode G3 and is also connected through both a fourth switching diode G4 and through a series circuit being formed of a capacitor CL and the primary winding of a current sensor transformer Tr2, to the negative supply potential $V_D$. The resonant circuit of the resonant converter power supply circuit element is defined by a series circuit being formed of the primary winding of the transformer Tr1, the capacitor CL and the primary winding of the current sensor transformer Tr2. The inductance of the primary winding of the transformer Tr1 and the capacitance of the capacitor CL define the reference frequency of the resonance circuit and the primary winding of the current sensor transformer Tr2 is negligible, because of the high winding ratio of that transformer. The secondary circuit of the current sensor transformer Tr2 is loaded with a second measuring resistor R2, across which a voltage equivalent to the primary current of the transformer Tr1 drops. This voltage serves to act upon the actual-value inputs of two window comparators K3a, K3b and K4a, K4b, respectively.

The first of these window comparators, which is formed by the two comparators K3a and K3b along with a first OR element OR1, has a somewhat larger window width. The threshold values of the window are adjustable by means of controllable voltage sources U3a and U3b. The output of the first OR element OR1, which is equivalent to the output of the first window comparator, is connected to the signal input of a control element S, in particular to the input of a control logic circuit SL contained therein and to the setting input of a fourth edge-controlled RS flip-flop FF4. In FIG. 2, the edge-controlled RS flip-flop FF4 is shown as being triggered at the trailing edge, since an OR element, rather than a NOT-OR element, was used to link the two comparators K3a and K3b because of its shorter signal transit time. The second window comparator, which is formed by the two comparators K4a and K4b and a second OR element OR2, has a narrow window compared with that of the first window comparator. The narrow window is set by two constant voltage sources U4a and U4b. The output of the second OR element OR2, which forms the output of the second window comparator, is connected to both the resetting input of the fourth RS flip-flop FF4 and the resetting input of a third RS flip-flop FF3. The output of the aforementioned control logic circuit SL is connected to the input of a divider flip-flop TFF and to the setting input of the third RS flip-flop FF3. The two outputs of the divider flip-flop TFF form the outputs of the control element S, with one output being connected to the signal input of a second driver stage T2 and the other output being connected to the signal input of the third driver stage T3. In the same manner as the output of the first RS flip-flop FF1 in FIG. 1, the output of the third RS flip-flop FF3 is connected to one input of a time comparison stage IS, IQ, C. Analogously to the output of the second RS flip-flop FF2 in FIG. 1, the output of the fourth RS flip-flop FF4 is connected to the other input of the time comparison stage IS, IQ, C. Analogously to the circuit shown in FIG. 1, the output of the time comparison stage serves to vary the controllable voltage sources U3a and U3b. The output of the second driver stage T2 is connected to the input of a second coupling network KP2, that has an output which is interconnected with the control input of the second power switching transistor Q2. The output of the third driver stage T3 is connected to the input of a third coupling network KP3, that has an output which is interconnected with the control input of the third power switching transistor Q3.

The second driver stage T2, the second coupling network KP2 and the second power switching transistor Q2, along with the third driver stage T3, the third coupling network KP3 and the third power switching transistor Q3 should be constructed as symmetrically as possible. Whenever the control logic circuit SL sends a switching signal to one of the power switching transistors Q2 or Q3, the third RS flip-flop FF3 is set. Whenever one of the two power switching transistors Q2 or Q3 switches, the voltage level that drops across the second measuring resistor R2 changes from the zero level. This leads to a rising edge at the output of the second window comparator K4a, K4b, OR2, so that the third RS flip-flop FF3 is reset. The third RS flip-flop FF3 is thus set for the duration of the signal transit time by the divider flip-flop TFF along with the driver stage T2, T3, the coupling network KP2, KP3 and a power switching transistor Q2, Q3. During this time, the capacitor C is charged at the constant current $i_Q$ through the constant current source IQ. If the voltage dropping across the second measuring resistor R2 drops quantitatively below a certain threshold set by the controllable voltage sources U3a and U3b, then a trailing edge appears at the output of the first window comparator and therefore at the output of the first OR element OR1, and this trailing edge enables the control logic and also sets the fourth RS flip-flop FF4. If the voltage dropping across the second measuring resistor R2 drops quantitatively below the threshold representing the actual zero crossing, which is defined by the constant current sources U4a and U4b, then a trailing edge appears at the output of the second OR gate OR2, which does not vary the third RS flip-flop FF3 but resets the fourth RS flip-flop FF4. Accordingly, the fourth RS flip-flop FF4 is set for the period that is located between the switching of the first window comparator (having the wider window width) and the switching of the second window comparator (having the narrower window width). While the fourth RS flip-flop FF4 is set, the switchable current sink IS discharges the capacitor C at the constant current $i_S$. The voltage $v_C$ dropping across the capacitor C thus receives a closed-loop control signal $dv_C$, which is obtained as follows:

$$dv_C = (i_Q t_K - i_S t_{K3})1/C,$$

where $t_{K3}$ is equivalent to the derivative action time of the zero crossing detector, and $t_K$ is equivalent to the mean value of signal transit times through the driver stage T2 or T3, the coupling network KP2 or KP3, and the power switching transistor Q2 or Q3, respectively, and through the divider flip-flop TFF.

Since it is only after the shutoff of one switching transistor that the other switching transistor can be allowed to be switched on again with push-pull resonant converter power supply circuit elements, an idle time is always necessary for safety reasons between the actual zero crossing of the electric reference variable and the switching of the switching transistor back on again in generic power supply circuit elements. In circuits according to the invention, this idle time can be reduced to a negligible amount. As a result, the same power at a lower peak current, or a higher power at the same peak current, can be transmitted, making for a higher degree of utilization of the power components of the resonant converter power supply circuit element.

In single-phase resonant converter power supply circuit elements according to the invention as well, the degree of utilization can be increased by suitably adapting the ON time points to the actual course of the electrical reference variable.

I claim:

1. Method for closed-loop control of trigger signals of switching transistors in a resonant converter power supply circuit element having closed-loop control dependent on a zero crossing recognition, wherein a prematurely responding zero crossing detector is provided, which comprises generating with a switched constant current source and a capacitor an electrical value being proportional with a period of time between generation of a trigger signal and switching of the power transistor, generating with a voltage comparator an electrical value being proportional with a time duration between a premature response of the zero crossing detector and the actual zero crossing, comparing the electrical value being proportional with the period of time between the generation of the trigger signal and the switching of the power transistor with the electrical value being proportional with the time interval between the premature response of the zero crossing detector and the actual zero crossing, obtaining a closed-loop control signal for controlling a deviation action threshold of the zero crossing detector, and ascertaining the actual zero crossing with a zero crossing detector without deviation action, and enabling the trigger signals with a zero crossing detector having deviation action.

2. Method according to claim 1, which comprises operating the resonant converter power supply circuit element by the zero current switch method.

3. Method according to claim 1, which comprises operating the resonant converter power supply circuit element by the zero voltage switch method.

4. Method according to claim 1, which comprises operating the resonant converter power supply circuit element by the single-phase method.

5. Method according to claim 1, which comprises operating the resonant converter power supply circuit element by the push-pull method.

6. In a resonant converter power supply circuit element having a switching transistor and closed-loop control dependent on a zero crossing recognition, a circuit configuration for closed-loop control of trigger signals for the switching transistor, comprising a prematurely responding zero crossing detector having deviation action, an output and a deviation action threshold, a zero crossing detector without deviation action having an output; a first RS flip-flop triggered at rising edges and a second edge-triggered RS flip-flop each having setting and resetting inputs and an output; at least one driver stage having a trigger signal acting upon the setting input of said first RS flip-flop, said at least one driver stage triggering the switching transistor, said first RS flip-flop being reset as a function of the switching state of the switching transistor; and a time comparison stage having two inputs and an output, the output of said first RS flip-flop being connected to one of the inputs of said time comparison stage; the output of said zero crossing detector having deviation action being connected to the setting input of said second RS flip-flop; the output of said zero crossing detector without deviation action being connected to the resetting input of said second RS flip-flop; and the output of said second RS flip-flop being connected to another of the inputs of said time comparison stage; the output of said time comparison stage providing an outcome of a comparison of the signal duration of output signals of said first and second RS flip-flops for controlling the deviation action threshold of the zero crossing detector having deviation action.

7. Circuit configuration according to claim 6, wherein said time comparison stage is formed of a capacitor, a switchable current source for charging said capacitor, and a switchable current sink for discharging said capacitor; said current source has a control input forming one of the inputs of said time comparison stage and said current sink has a control input forming the other input of said time comparison stage; and said time comparison stage has an output variable being the instantaneous voltage value present across said capacitor.

* * * * *